(12) United States Patent
Pan

(10) Patent No.: US 8,109,125 B2
(45) Date of Patent: Feb. 7, 2012

(54) METHOD AND APPARATUS FOR MANUFACTURING ULTRALOW-RESISTANCE CURRENT SENSORS

(76) Inventor: Jen-Huan Pan, Taipei County (TW)

( * ) Notice: Subject to any disclaimer, the term of this patent is extended or adjusted under 35 U.S.C. 154(b) by 648 days.

(21) Appl. No.: 12/327,268

(22) Filed: Dec. 3, 2008

(65) Prior Publication Data

US 2009/0272169 A1   Nov. 5, 2009

(30) Foreign Application Priority Data

May 5, 2008   (TW) ................................ 97116528 A

(51) Int. Cl.
*B21B 1/18* (2006.01)
(52) U.S. Cl. ............. 72/365.2; 72/204; 72/221; 72/234; 29/595; 29/614; 29/898.03
(58) Field of Classification Search ..................... 72/204, 72/206, 221, 234, 256, 365.2, 366.2; 29/595, 29/614, 898.03
See application file for complete search history.

(56) References Cited

U.S. PATENT DOCUMENTS

| | | | | | |
|---|---|---|---|---|---|
| 4,622,835 | A | * | 11/1986 | Bisson et al. | 72/18.8 |
| 4,779,439 | A | * | 10/1988 | Baldi | 72/204 |
| 4,996,113 | A | * | 2/1991 | Hector et al. | 428/600 |
| 6,957,488 | B2 | * | 10/2005 | Kawashima et al. | 29/898.03 |
| 7,237,415 | B2 | * | 7/2007 | Wu | 72/206 |

* cited by examiner

*Primary Examiner* — David Jones

(74) *Attorney, Agent, or Firm* — Rosenberg, Klein & Lee

(57) ABSTRACT

A method for manufacturing ultralow-resistance current sensors of size 0402 to 4518 of IEEE specifications includes the steps of: a raw metallic strip being pressed to roll over a first tension roller, a cutting tool over the first tension roller being fed to cut the raw metallic strip so as to form a deep groove thereof along the moving metallic strip, an insulating material being filled into and along the deep groove so as to form an lengthwise insulating portion of the metallic strip, and the metallic strip with the insulating portion being segmented into a plurality of ultralow-resistance current sensors.

4 Claims, 7 Drawing Sheets

METHOD AND APPARATUS FOR MANUFACTURING ULTRALOW-RESISTANCE CURRENT SENSORS

This application claims the benefit of Taiwan Patent Application Serial No. 097116528, filed May 5, 2008, the subject matter of which is incorporated herein by reference.

BACKGROUND OF THE INVENTION (1) Field of the Invention

The present invention relates to a method for producing ultralow-resistance current sensors and an apparatus for processing the same.

(2) Description of the Prior Art

The ultralow-resistance current sensor, also called the current-sensing resistor, a kind of current-induced electronic elements whose resistances are ranged between 0.1Ω and 0.0005Ω, is usually used for monitoring working voltages of various circuit designs. For example, the ultralow-resistance current sensor can be used as a recharge indicator for batteries, or a monitor for working currents or working voltages. In particular, the ultralow-resistance current sensor is now playing an important role in energy-saving and carbon-reduction design.

Current sensors can be manufactured by microlithography or by punching process, which has the advantage of maintaining metallic characteristics. However, microlithography can produce only current sensors of sizes larger than 1206. Cost is high, and deep grooves are difficult to achieve. The process is also time-consuming and liable to environmental protection issues. Further, the current sensors manufactured by punching are restricted to sizes larger than 4518. It is therefore not easy to miniaturize electronic elements by metal manufacturing processes to meet the requirement of portable electronic devices.

On the other hand, the size of the ultralow-resistance current sensor can be significantly reduced by the thin-film process, in which non-solid metallic material is applied on a substrate, ceramic or otherwise, to form the basic structure of the ultralow-resistance current sensor. In this light, the size of the ultralow-resistance current sensor can reach 0201. However, this process changes metallic configurations, deteriorates metallic characteristics, and results in significantly elevated resistance in response to in creasing ambient temperature. Thus, although the thin film process can miniaturize the ultralow-resistance current sensor, it yields products with high measurement errors, which is causes for major concerns; in particular, for the high-end products of portable electronic devices.

SUMMARY OF THE INVENTION

It is an object of the present invention to provide a method and an apparatus for manufacturing ultralow-resistance current sensors in accordance with a metal manufacturing process, which can better maintain metallic characteristics during the production process and can yield products of sizes substantially smaller than that achieved by the aforesaid punching process or microlithography.

In the present invention, the size of the ultralow-resistance current sensor can reach the range between sizes 0402 and 4518 of IEEE specifications.

In the present invention, the ultralow-resistance current sensor consists of a metallic portion and an insulating portion. The apparatus for producing the ultralow-resistance current sensors consists of a first tension roller, a main power spindle, and a cutting tool.

In the present invention, a metallic strip for producing the ultralow-resistance current sensors has a first surface and an opposing second surface, in which the first surface is to contact directly with the first tension roller.

The main power spindle is positioned in proximity to the front portion of the metallic strip and used to draw the metallic strip over the surface of the first tension roller.

The cutting tool is positioned in proximity to the surface of the first tension roller and used to cut a tension surface of the moving metallic strip so that a groove can be formed along the moving direction (namely, the lengthwise direction).

The insulating material is filled into the groove to form the insulating portion and the metallic strip thus filled is cut into segments, such that a plurality of ultralow-resistance current sensors can be produced and the manufacturing process is then completed.

The tension roller is utilized to stabilize the metallic strip while the in-length deep groove is formed. Upon such an arrangement, the ultralow-resistance current sensor can be manufactured by the aforesaid automatic precision machining without sacrificing its metallic characteristics.

All these objects are achieved by the method and the apparatus for manufacturing ultralow-resistance current sensors described below.

BRIEF DESCRIPTION OF THE DRAWINGS

The present invention can be fully understood from the following detailed description and the preferred embodiment with reference to the accompanying drawings, in which.

DESCRIPTION OF THE PREFERRED EMBODIMENT

The invention disclosed herein is directed to a method and an apparatus for manufacturing ultralow-resistance current sensors. In the following description, numerous details are set forth in order to provide a thorough understanding of the present invention. It will be appreciated by one skilled in the art that variations of these specific details are possible while still able to achieve the results of the present invention. In other instance, well-known components are not described in detail in order not to unnecessarily obscure the present invention.

The following detailed description is of the best known modes of realizing the invention. This description is not to be taken in a limiting sense, but is made merely for the purpose of illustrating general principles of embodiments of the invention. The scope of the invention is best defined by the appended claims.

In the present invention, the size of the ultralow-resistance current sensor is in the range between 0402 and 4518 of IEEE specifications. It is noted that the range between 0402 and 1206 is beyond the reach of any prior art. The ultralow-resistance current sensor produced by the present invention can have better metallic characteristics.

Figure 1:
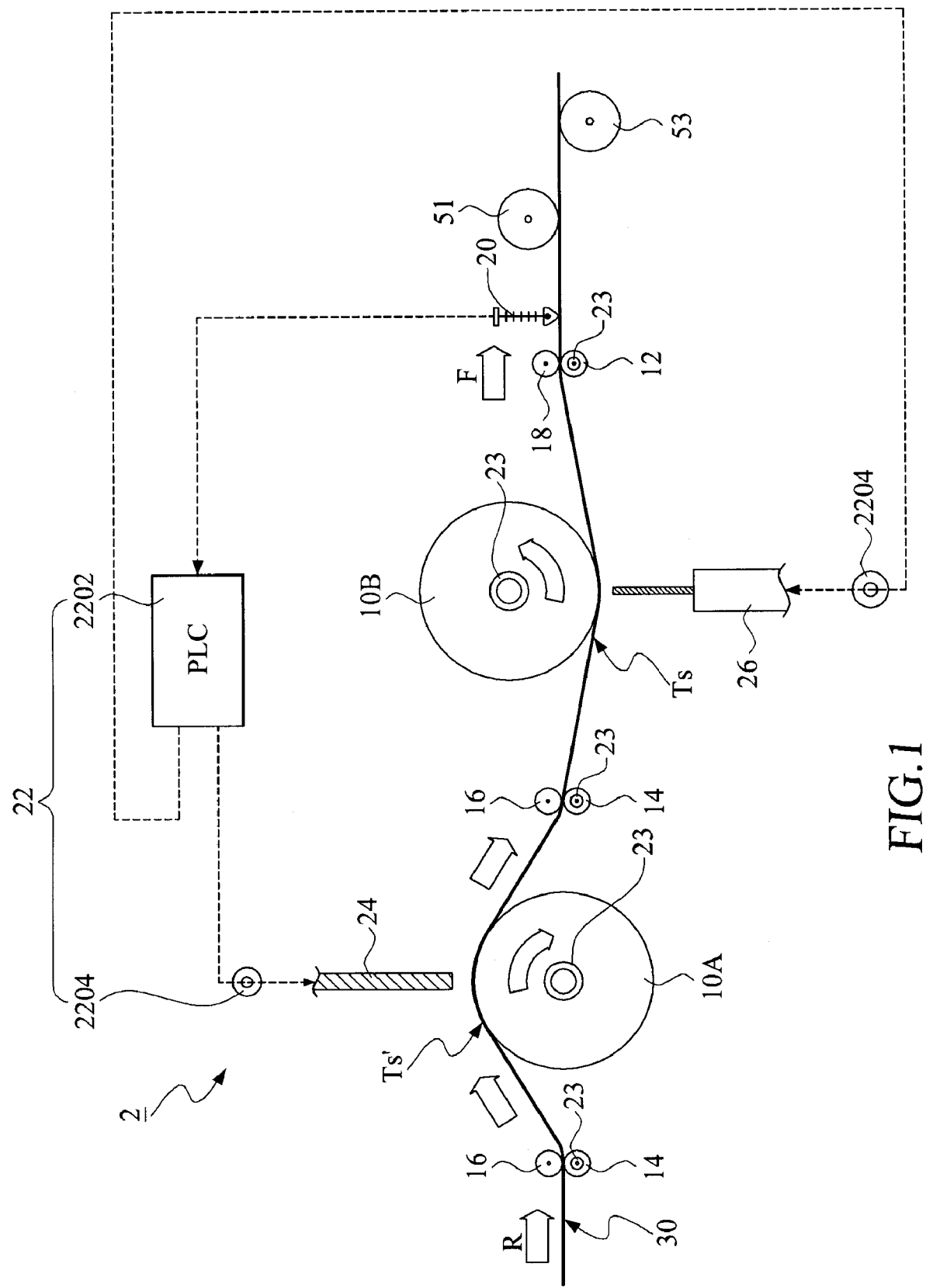
FIG. 1 is a schematic plan view of a preferred apparatus for manufacturing ultralow-resistance current sensors in accordance with the present invention.

Referring to FIG. 1, it shows a schematic plan view of a preferred apparatus 2 for manufacturing ultralow-resistance current sensors of the present invention. The apparatus 2 includes a first tension roller 10B, a second tension roller 10A, a main power spindle 12, two auxiliary power spindles 14, a profile milling wheel 24 and a cutting tool 26.

Figure 2:
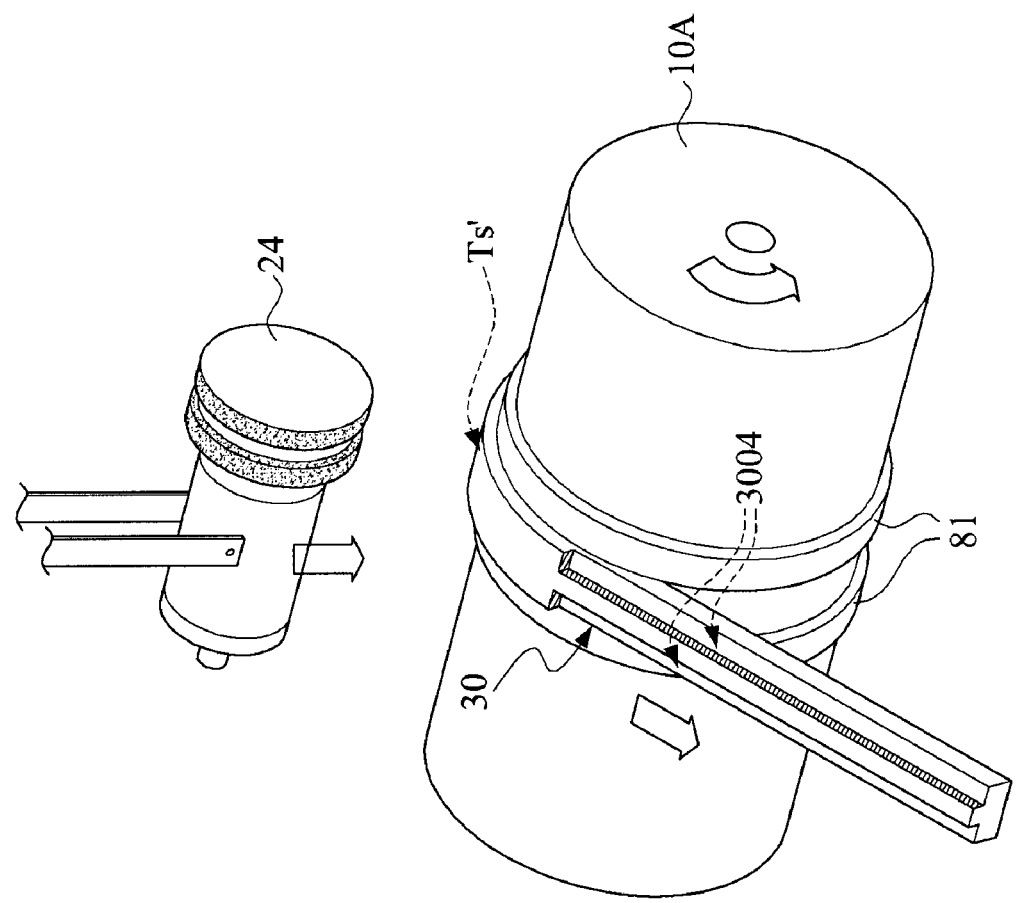
FIG. 2 is a schematic perspective view showing how a profile milling wheel can cut the metallic strip which is moving over the second tension roller in accordance with the present invention.

Refer to FIGS. 1 and 2, in which FIG. 2 shows how the profile milling wheel 24 cuts the metallic strip 30 which is moving along the production line according to the present invention. In order to prepare for a later thermal mold packaging (encapsulation), two shoulder-shaped edges 3004 are formed such that encapsulation is implemented thereupon at a later stage. The profile milling wheel 24 is positioned in proximity to the second tension roller 10A of the apparatus 2, and a pair of positioning collars 81 on the second tension roller 10A are used to help position the metallic strip 30 in between while the metallic strip 30 rolls over the second tension roller 10A. Also, while in rolling over, the metallic strip 30 is firmly pressed against the surface of the second tension roller 10A. The exterior surface of the metallic strip 30 with respect to the second tension roller 10A is a tension surface Ts' which is subjected to machining by the profile milling wheel 24, so that two shoulder-shaped edges 3004 are formed along two lateral sides of the tension surface Ts' of the metallic strip 30 along the moving direction (namely, the lengthwise direction of the metallic strip 30).

Figure 3:
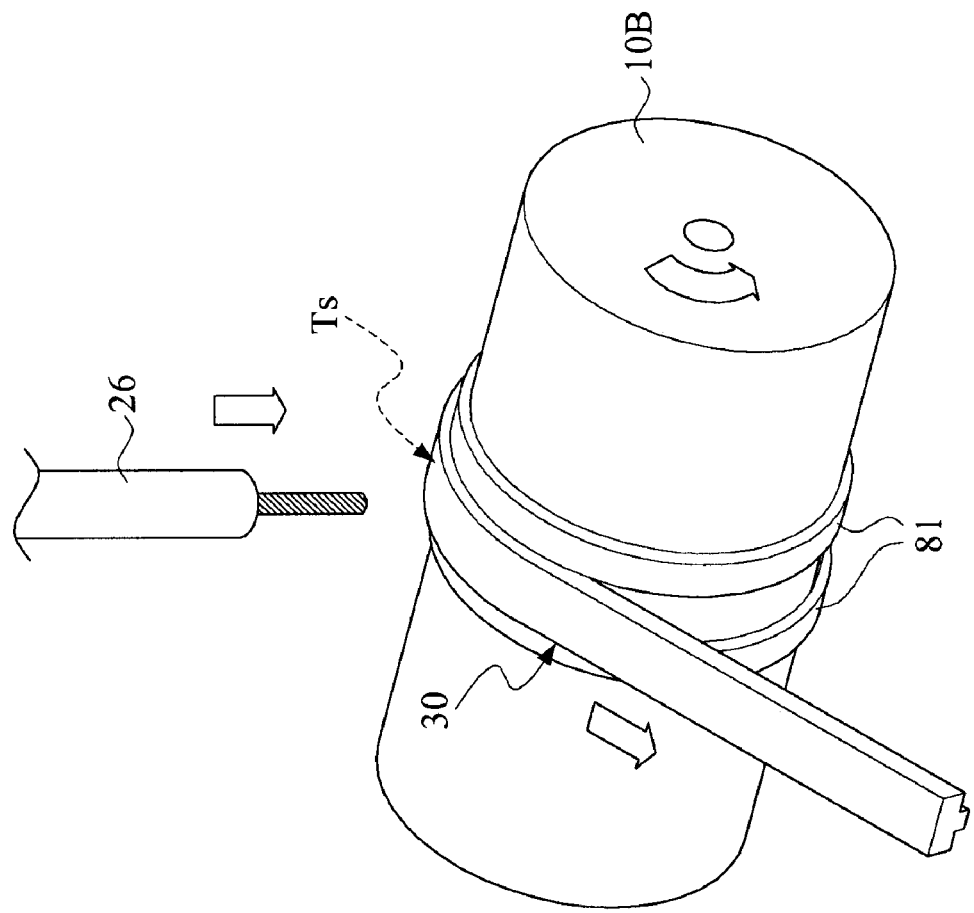
FIG. 3 and FIG. 4 are two consecutive perspective views showing how a cutting tool can be fed to cut a metallic strip for forming a middle lengthwise groove while being pressed against the first tension roller in accordance with the present invention.

Referring to FIGS. 1 & 3, FIG. 3 illustrates how the metallic strip 30 is pressed against the first tension roller 10B according to the present invention. After the two aforesaid shoulder-shaped edges 3004 is formed on the metallic strip 30, the metallic strip 30 is drawn along the longitudinal direction and is firmly pressed against the first tension roller 10B, similarly confined by a pair of positioning collars 81 on the first tension roller 10B. The exterior surface of the metallic strip 30 with respect to the first roller 10B is a tension surface Ts. As shown in FIG. 3, the cutting tool 26 is positioned in proximity to the first tension roller 10B and used to cut the tension surface Ts of the metallic strip 30.

Referring back to FIG. 1 again, the main power spindle 12 is positioned at the front portion F (the leading end) of the metallic strip 30 and used to draw the metallic strip 30 over the first tension roller 10B and the second tension roller 10A. Two auxiliary power spindles 14 are respectively positioned at the middle portion and the rear portion R (the tailing end) of the metallic strip 30 so as to help the drawing of the metallic strip 30 over the first tension roller 10B and the second tension roller 10A.

Furthermore, the apparatus 2 can include two first positioning rollers 16 and a second positioning roller 18 to pair with the two auxiliary power spindles 14 and the main power spindle 12, respectively.

The first tension roller 10B, the second tension roller 10A, the main power spindle 12 and the auxiliary power spindles 14 are rotated directly by external power (not shown in the figure), while the first positioning spindles 16 and the second positioning spindle 18 are passively rotated. Because the first tension roller 10B, the second tension roller 10A, the main power spindle 12 and the auxiliary power spindles 14 are rotated by external power, rotation speeds of the first tension roller 10B, the second tension roller 10A, the main power spindle 12 and the auxiliary power spindles 14 can be kept identical so as to maintain the tension of the metallic strip 30. As shown in FIG. 1, a clutch 23 is included to each of the aforesaid spindles 12, 14 so as to render controllable the rotation speed of the metallic strip 30.

Figure 4:
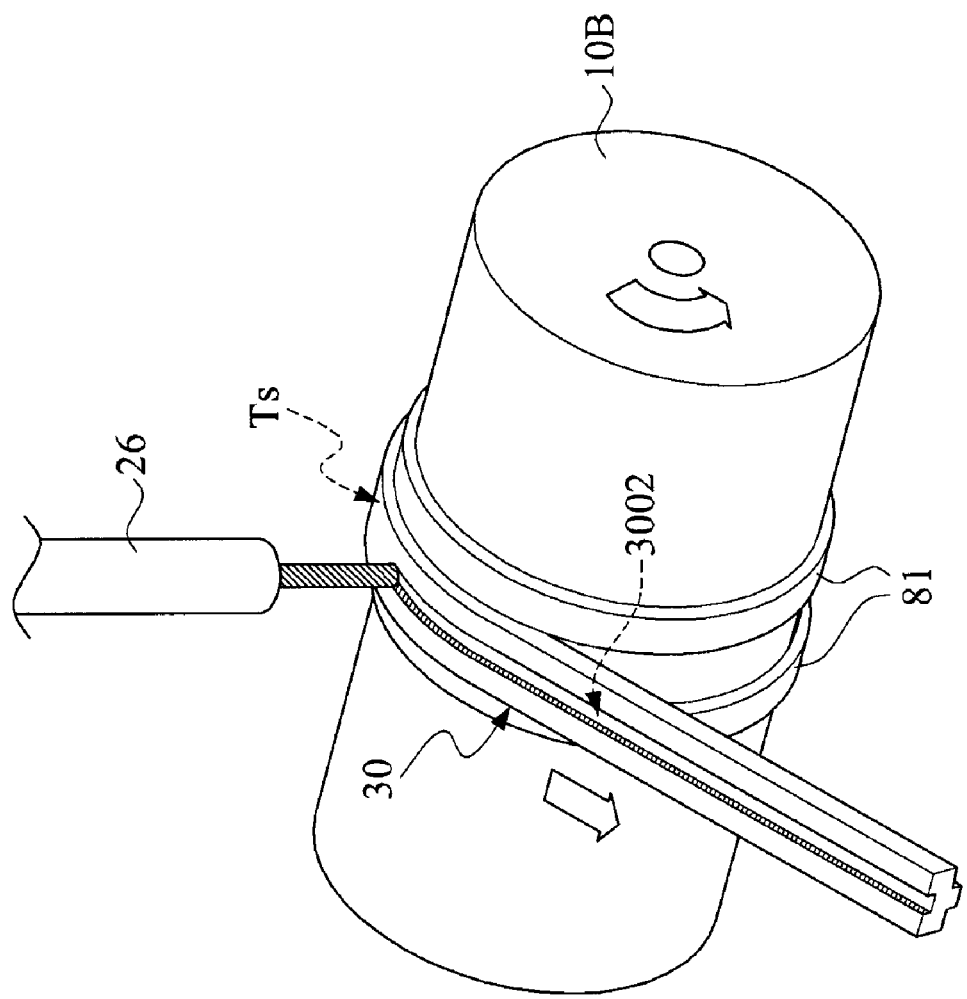

Refer to FIGS. 1 and 4, in which FIG. 4 illustrates that the cutting tool 26 is used to cut the metallic strip 30 which is moving by the first tension roller 10B according to the present invention. The cutting tool 26 is controlled and fed by a programmable logic controller (PLC) 2202 as shown in FIG. 1 so that cutting depth on the tension surface Ts can be controlled. The cutting tool 26 continues to cut the middle of the tension surface of the moving metallic strip 30 so that a middle lengthwise groove can be formed. The metallic strip 30 of the present invention can be made of a material chosen from a group including copper, manganese and chromium.

Referring back to FIG. 1 again, a thickness measurement element 20 is positioned at the front portion of the metallic strip 30 to measure the thickness of the metallic strip 30, especially the depth of the groove, after it is cut. The apparatus 2 further includes a control element 22 consisted of a PLC 2202 and a power source 2204. The PLC 2202 of the control element 22 is used to receive the thickness data of the metallic strip 30 measured by the thickness measurement element 20. In response to the thickness of the metallic strip 30, the cutting tool 26 and the profile milling wheel 24 can be properly adjusted for precise cutting of the groove 3002 and milling of the two shoulder-shaped edges 3004, respectively.

As shown in FIG. 1, a non-cutting wheel 51 and a polish wheel 53 are positioned at the right side (i.e. the downstream side) of the thickness measurement element 20. The non-cutting wheel 51 is used to deburr the exposed surface of the metallic strip 30 having the two shoulder-shaped edges 3004, and the polish wheel 53 is used to polish the surface having the middle groove 3002.

Figure 5:
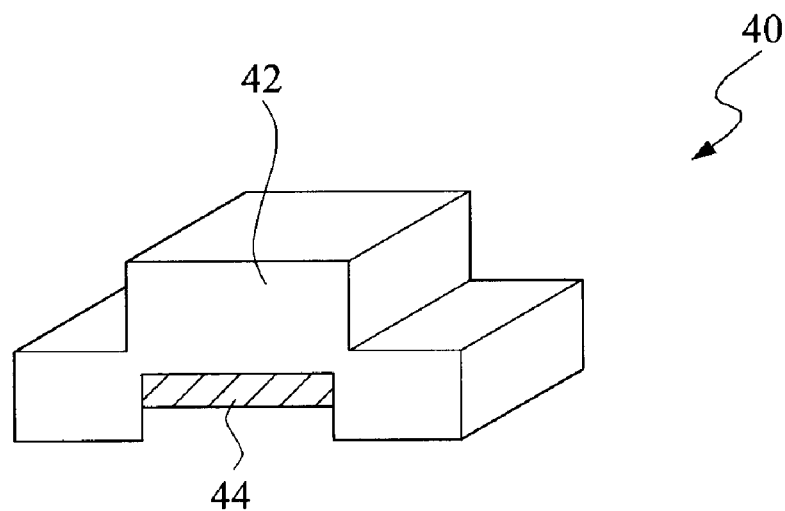
FIG. 5 is a perspective view of an ultralow-resistance current sensor before encapsulation according to the present invention.

Referring to FIG. 5, it illustrates a perspective view of an ultralow-resistance current sensor 40 before the encapsulation process according to the present invention, in which the insulating material is filled into the groove 3002 so as to form an insulating layer 44 as shown in FIG. 5. The ultralow-resistance current sensor 40 includes a metallic portion 42 and an insulating portion 44. In the present invention, the groove 3002 of the finish metallic strip 30 from FIG. 1 can be filled with the insulating material and can be further segmented so as to produce a plurality of the ultralow-resistance current sensors 40.

With the help of the aforesaid machining process, the size of the ultralow-resistance current sensor 40 can reach the range of 0402 to 4518 of IEEE specifications. In addition, perpendicularity of the upright surface of the ultralow-resistance current sensor 40 can be lowered to 0.005 mm, and roughness of the upright surface can be down to 0.05 μm.

Figure 6:
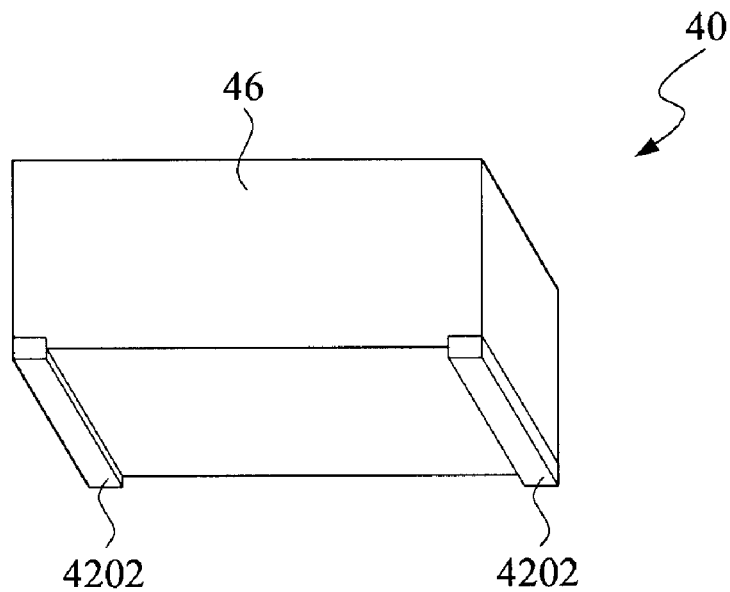
FIG. 6 is a perspective view of the ultralow-resistance current sensor of FIG. 5 after the encapsulation according to the present invention.
Figure 7:
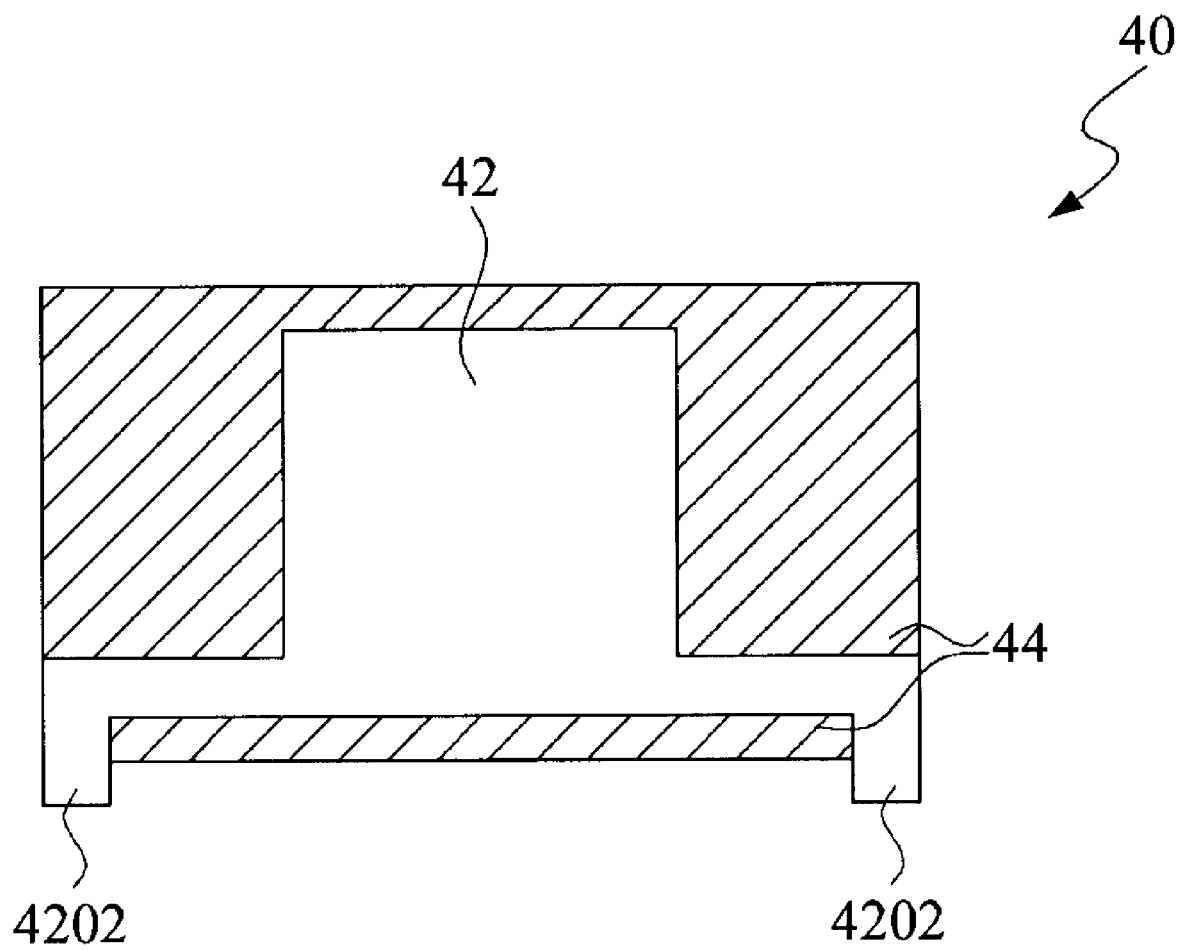
FIG. 7 is a cross-sectional view of the ultralow-resistance current sensor of FIG. 6.

Referring to FIG. 6 and FIG. 7, a perspective view and its cross-sectional view of the ultralow-resistance current sensor 40 of FIG. 5 after packaging are shown, respectively. The insulation material described above can be simultaneously used to package the metallic portion 42, while the insulating portion 44 is formed within the groove 3002. In the packaging, two soldering feet 4202, i.e. coast bands of the groove 3002, from the metallic portion 42 are exposed and ready for soldering to join a circuit board (not shown in the figure).

The ultralow-resistance current sensor 40 after packaging (encapsulation) is now subjected to measurement. Tests and results are provided in the following table which shows a qualified ultralow-resistance current sensor 40.

Step S18: The non-cutting wheel 51 is used to deburr the surface having the two shoulder-shaped edges 3004.

Step S20: The polish wheel 53 is used to polish the surface having the groove 3002.

Step S22: The insulating material is filled into the groove 3002 of the metallic strip 30.

TABLE 1

Performance measurement of the ultralow-resistance current sensor

| Parameter/Standard | Conditions of Test | Test Results |
|---|---|---|
| Thermo Shock/MIL-DTD-202 Method 107 | −65° C., +0° C., −5° C.~+125° C., +3° C., −0° C. (five cycles), each steps is maintained for at least five minutes | ±(1% + 0.5 mΩ)ΔR |
| Short Time Overload/ MIL-PRF-49465 4.8.8 | Overload voltage: 5 times watts (duration: 5 s) | ±(1% + 0.5 mΩ)ΔR |
| Solderability/JIS C 5201 4.17 | Immersion Temp(235 ± 5° C.), Duration of Immersion(2 ± 0.5 s), Depth of Immersion: 1.95~2 mm | more than 90% coverage of new soldering point |
| Resistance to Solder Heat/JIS C 5201 4.18 | Immersion Temp (260 ± 5° C.), Duration of Immersion (5 ± 0.5 s) | ±(1% + 0.5 mΩ)ΔR |
| Dielectric W/ Voltage/ MIL-STD-202 Method 202 | Test Voltage: More than 1000 $V_{rms}$ for one minutes | Qualified |
| Insulation Resistance/ MIL-STD-202 Method 302 | Test Voltage: 500 ± 10% $V_{rms}$ for one minutes | >$10^9$ Ω |
| High Temp. Exposure/JIS C 5202 7.11 | Exposed to environment of 175~178° C. for 250 ± 8 hours | ±(1% + 0.5 mΩ)ΔR |
| Low Temp. Storage/JIS C 5202 7.1 | Exposed to environment of −65 ± 2° C., for 72 ± 4 hours | ±(1% + 0.5 mΩ)ΔR |
| Life/MIL-STD-202 Method 108 | Test Temp 70 ± 2° C. for 1000 hours and voltage change of cycle: turn on 1.5 hours and turn off 0.5 hours. | ±(1% ± 0.5 mΩ)ΔR |

Figure 8:
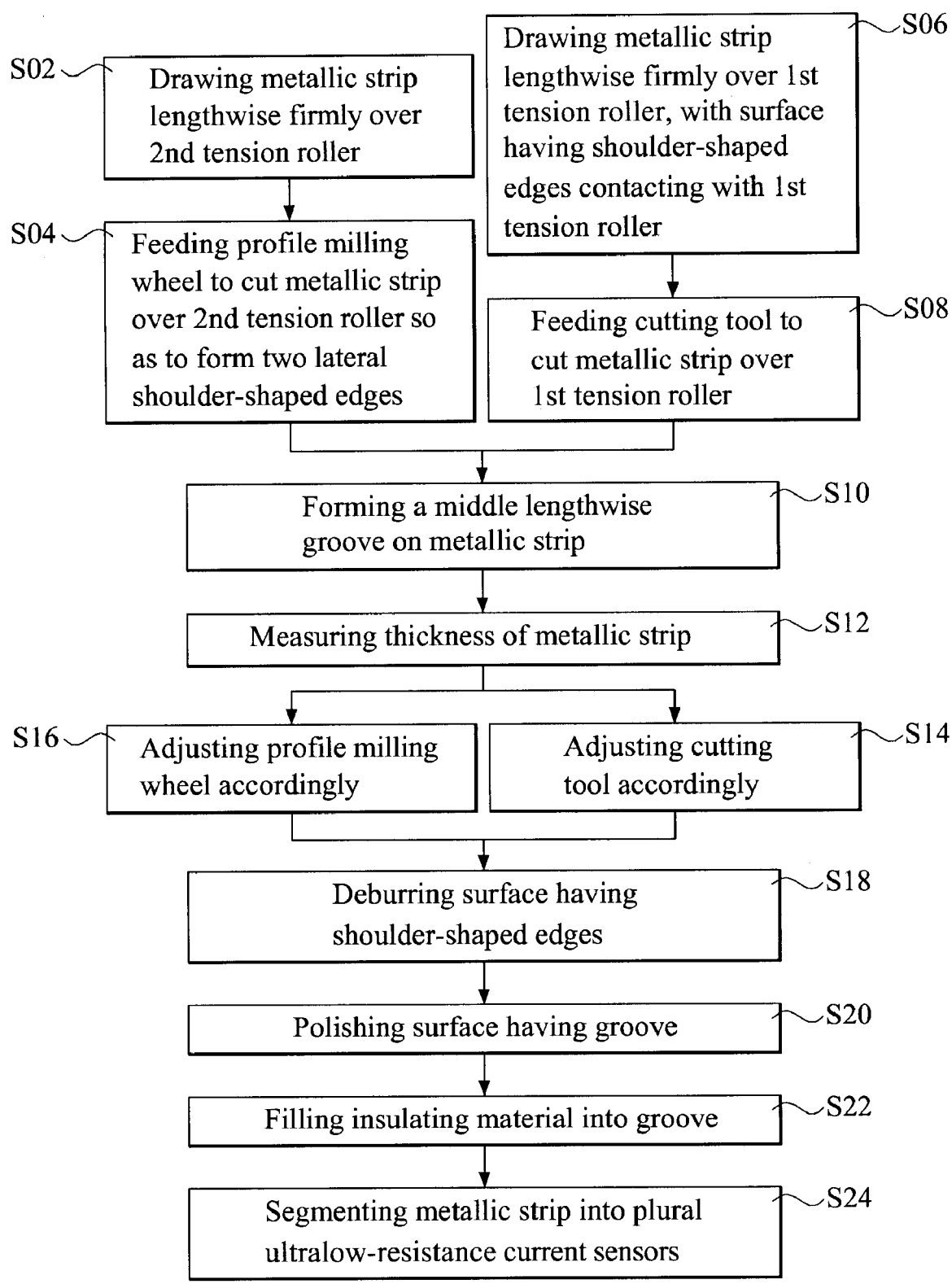
FIG. 8 is a flowchart of a preferred method for manufacturing the ultralow-resistance current sensor according to the present invention.

Referring to FIG. 8, it shows a flowchart of a preferred method for manufacturing the ultralow-resistance current sensor 40 according to the present invention. The method incorporated with the aforesaid apparatus includes the following steps.

Step S02: The metallic strip 30 drawn along a lengthwise direction is firmly pressed against the second tension roller 10A.

Step S04: The profile milling wheel 24 is fed to cut the exposed surface of the metallic strip 30 over the second tension roller 10A so as to form two shoulder-shaped edges 3004 along the two lateral sides of the tension surface of the metallic strip 30.

Step S06: The metallic strip 30 is further firmly pressed against the first tension roller 10B, with the surface having the shoulder-shaped edges 3004 contact with the first tension roller 10B.

Step S08: The cutting tool 26 is fed to cut the exposed surface of the metallic strip 30 over the first tension roller 10B.

Step S10: The metallic strip 30 drawn along the lengthwise direction is then cut, by the cutting tool 26, to form a middle lengthwise groove 3002 on the now-exposed surface of the metallic strip 30.

Step S12: The thickness of the metallic strip 30 is measured.

Step S14: In response to the thickness of the metallic strip 30, the cutting tool 26 is adjusted to form precisely the correct depth of the groove 3002.

Step S16: The depths of the two shoulder-shaped edges 3004 which are cut by the profile milling wheel 24 is also controlled in response to the measured thickness of the metallic strip 30.

Step S24: The metallic strip 30 having the groove 3002 filled with the insulating material is cut into segments so that a plurality of ultralow-resistance current sensors 40 without packaging can be produced. Alternatively, the insulating material can also be used to encapsulate the segmented sensors 40 after the metallic strip 30 filled with the insulating portion is cut. Two soldering feet of the sensor 40 are also formed from exposing the coast bands of the groove 3002.

In the present invention, the first tension roller 10B is utilized to stabilize the metallic strip 30 while the lengthwise deep groove 3002 is formed. Upon such an arrangement, the ultralow-resistance current sensor 40 can be manufactured by the aforesaid automatic precision machining without sacrificing its metallic characteristics.

While the present invention has been particularly shown and described with reference to a preferred embodiment, it will be understood by those skilled in the art that various changes in form and detail are possible without departing from the spirit and scope of the present invention.

I claim:

1. A method for manufacturing ultralow-resistance current sensors, comprising the steps of:
    (a) drawing a metallic strip having a first surface and an opposing second surface thereof;
    (b) using a cutting tool to cut into the first surface of the metallic strip by a predetermined depth;
    (c) drawing the metallic strip along a lengthwise direction so that a lengthwise groove is continually formed in middle portion of the first surface while the metallic strip is drawn;
    (d) filling an insulating material into the groove of the metallic strip; and (e) cutting into segments the metallic strip filled with the insulating material so as to produce a plurality of the ultralow-resistance current sensors.

2. The method as claimed in claim 1, further comprising, between said step (a) and said step (b), a step of using a profile milling wheel to cut continually said second surface of said metallic strip such that two lateral shoulder-shaped edges are formed lengthwise along said metallic strip.

3. The method as claimed in claim 1, further comprising, between said step (c) and said step (d), a measurement step of measuring a thickness of said metallic strip, and a correction step of controlling said cutting tool of said step (b) to cut correctly said groove into said predetermined depth in response to measurement results from the previous measurement step.

4. The method as claimed in claim 1, wherein the size of said ultralow-resistance current sensor is within the range of 0402 to 4518 of IEEE specifications.

* * * * *